(12) United States Patent
Wang et al.

(10) Patent No.: US 8,437,136 B2
(45) Date of Patent: *May 7, 2013

(54) THERMAL INTERFACE MATERIAL AND METHOD OF USING THE SAME AND ELECTRONIC ASSEMBLY HAVING THE SAME

(75) Inventors: You-Sen Wang, Beijing (CN); Yuan Yao, Beijing (CN); Feng-Wei Dai, Beijing (CN); Ji-Cun Wang, Beijing (CN); Hui-Ling Zhang, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 336 days.

This patent is subject to a terminal disclaimer.

(21) Appl. No.: 12/578,763

(22) Filed: Oct. 14, 2009

(65) Prior Publication Data

US 2010/0157538 A1 Jun. 24, 2010

(30) Foreign Application Priority Data

Dec. 24, 2008 (CN) .......................... 2008 1 0241850

(51) Int. Cl.
*H05K 7/20* (2006.01)

(52) U.S. Cl.
USPC ........... 361/704; 361/707; 361/708; 361/709; 361/711; 361/712

(58) Field of Classification Search ................. None
See application file for complete search history.

(56) References Cited

U.S. PATENT DOCUMENTS

| | | | |
|---|---|---|---|
| 6,451,422 B1* | 9/2002 | Nguyen | 428/323 |
| 6,730,731 B2 | 5/2004 | Tobita et al. | |
| 7,252,877 B2* | 8/2007 | Jayaraman et al. | 428/323 |
| 7,473,995 B2* | 1/2009 | Rumer et al. | 257/707 |
| 8,081,469 B2* | 12/2011 | Wang et al. | 361/710 |
| 2003/0077478 A1 | 4/2003 | Dani et al. | |
| 2004/0125565 A1 | 7/2004 | Chen et al. | |
| 2006/0118791 A1 | 6/2006 | Leu et al. | |
| 2006/0160330 A1 | 7/2006 | Kobayashi et al. | |
| 2009/0068441 A1* | 3/2009 | Swaroop et al. | 428/329 |
| 2010/0328895 A1* | 12/2010 | Bhagwagar et al. | 361/704 |

FOREIGN PATENT DOCUMENTS

| | | |
|---|---|---|
| JP | 2006-202938 | 8/2006 |
| JP | 2006-321968 | 11/2006 |
| JP | 2008-41707 | 2/2008 |
| JP | 2008-63449 | 3/2008 |
| WO | 2007043419 | 4/2007 |

* cited by examiner

*Primary Examiner* — Jayprakash N Gandhi
*Assistant Examiner* — Dion Ferguson
(74) *Attorney, Agent, or Firm* — Altis Law Group, Inc.

(57) ABSTRACT

An electronic assembly includes a heat source having a maximum operating temperature, a heat dissipating device, a thermal interface material sandwiched between the heat source and the heat dissipating device. The thermal interface material includes a base and a plurality of first thermally conductive particles dispersed in the base. The first thermally conductive particles have a size monotonically changing from a first size less than 100 nanometers and a first melting temperature below the maximum operating temperature, to a second size larger than 100 nanometers and a second melting temperature above the maximum operating temperature when the heat source operates at a temperature above the first melting temperature and at or below the maximum operating temperature.

20 Claims, 5 Drawing Sheets

THERMAL INTERFACE MATERIAL AND METHOD OF USING THE SAME AND ELECTRONIC ASSEMBLY HAVING THE SAME

RELATED APPLICATION

This application is related to application entitled "THERMAL INTERFACE MATERIAL AND METHOD OF USING THE SAME AND ELECTRONIC ASSEMBLY HAVING THE SAME", U.S. patent application Ser. No. 12/578,772, filed Oct. 14, 2009.

BACKGROUND

1. Technical Field

The present disclosure relates to a thermal interface material, a method of using the same and an electronic assembly having the same.

2. Description of the Related Art

Electronic components such as semiconductor chips are becoming progressively smaller with each new product release, while at the same time the heat dissipation requirements of the electronic components are increasing due to their improved capacity to process data faster. Commonly, a thermal interface material is utilized between an electronic component and a heat sink to efficiently dissipate heat generated by the electronic component.

A conventional thermal interface material is made by diffusing particles with a high heat conduction coefficient in a base material. The particles can be made of graphite, boron nitride, silicon oxide, alumina, silver or other metals. However, the particles diffused in the base material usually have a very small surface area contacting both the electronic component and the heat sink, and a heat conduction coefficient of the thermal interface material is now considered to be too low for many contemporary applications.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments.

Corresponding reference characters indicate corresponding parts throughout the several views. The exemplifications set out herein illustrate at least one embodiment, in one form, and such exemplifications are not to be construed as limiting the scope of the disclosure in any manner.

DETAILED DESCRIPTION

Figure 1:
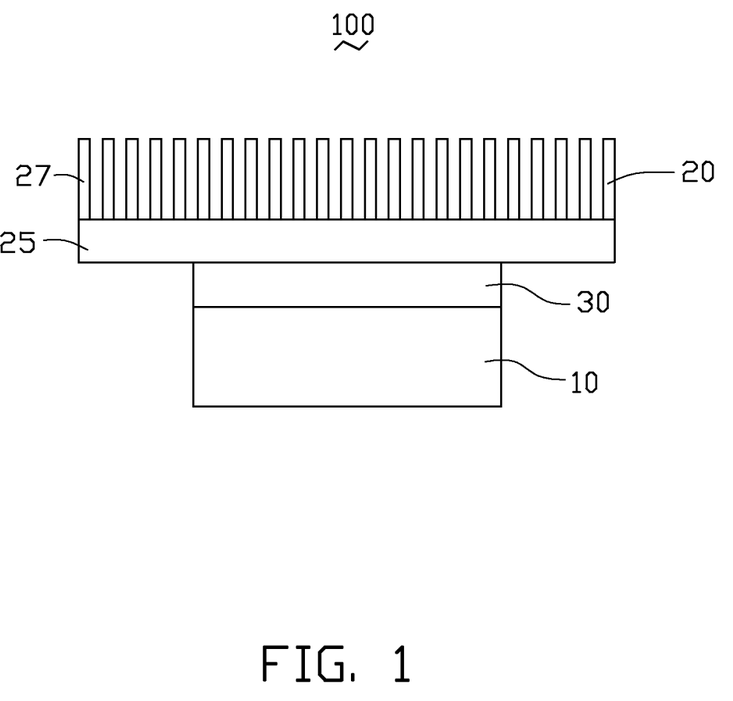
FIG. 1 is a schematic view of a first embodiment of a thermal interface material used in one embodiment of an electronic assembly.

FIG. 1 shows a schematic view of a first embodiment of a thermal interface material used in an electronic assembly. The thermal interface material 30 can be inserted between to be used for thermal coupling of a heat source 10 and a heat dissipating device 20. One embodiment of the electronic assembly 100 includes the heat source 10, the heat dissipating device 20, and the thermal interface material 30.

Figure 2:
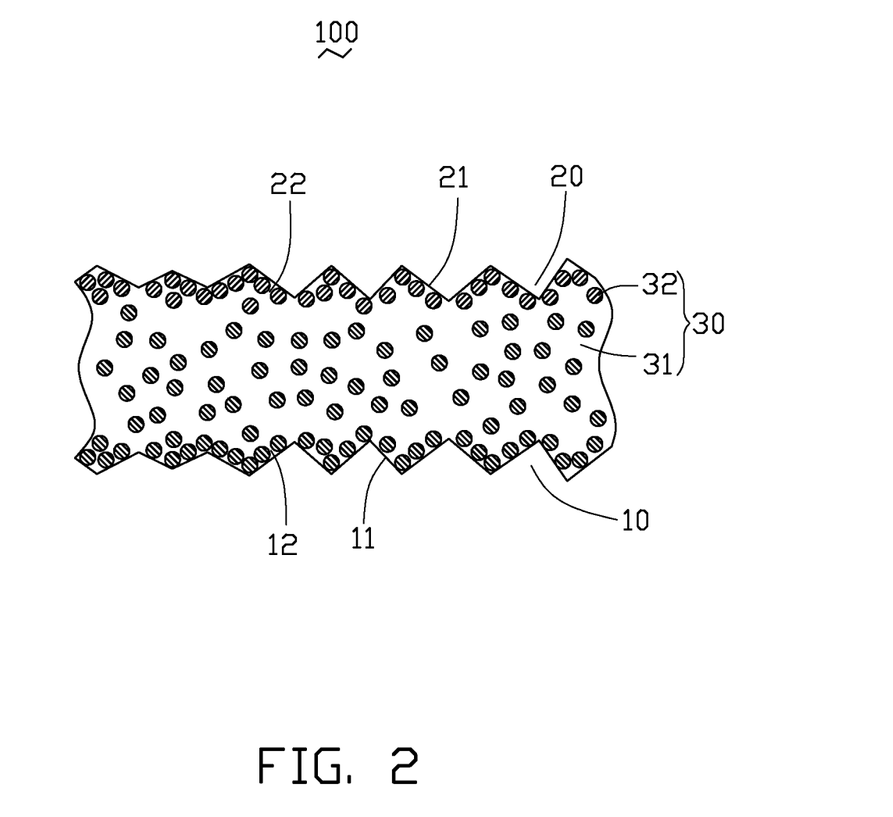
FIG. 2 is a schematic cross-sectional view of a microstructure of the thermal interface material of FIG. 1 before heating.

The heat source 10 is a heat-generating component, such as a semiconductor integrated device, an integrated circuit board, a resistor or other component which generates waste heat that needs to be dissipated. The heat source 10 has a maximum operating temperature. The heat source 10 is kept to operate at or below its maximum operating temperature, so as to prevent the heat source 10 from being damaged due to overheating. In this embodiment, the heat source 10 is a central processing unit (CPU) and has a maximum operating temperature of about 120° C. Referring also to FIG. 2, one surface of the heat source 10 near the heat dissipating device 20 is defined as a heat dissipating interface 11. The heat dissipating interface 11 is not smooth at the micro level and has a plurality of first tiny depressions 12 protruding therefrom. The size of the first tiny depressions 12 ranges from nanometer-level to micrometer-level.

The heat dissipating device 20 is used to absorb and dissipate the heat generated by the heat source 10 to prevent heat accumulation at the heat source 10. The heat dissipating device 20 includes a substrate 25 and a plurality of fins 27 vertically arranged on the substrate 25. A heat absorbing interface 21, opposite to the heat dissipating interface 11, is not smooth at the micro level and has a plurality of second tiny depressions 22 protruding therefrom. The size of the second tiny depressions 22 ranges from nanometer-level to micrometer-level. The first tiny depressions 12 and the second tiny depressions 22 can be filled up by the thermal interface material 30.

The thermal interface material 30 is positioned between the heat source 10 and the heat dissipating device 20 in actual application. The thermal interface material 30 includes a base 31 and a plurality of first thermally conductive particles 32 distributed in the base 31.

The base 31 can be a mixture of thermoplastic resin and thermosetting polymer to make the base 31 flexible. The thermoplastic resin can be an epoxy resin, a phenolic resin, a polyamide resin or the like. The thermosetting polymer can be a styrene-butasiene rubber, a sol-gel, a silica gel, or the like. In this embodiment, the base 31 is a mixture of a phenolic resin and a sol-gel, and is flexible.

The first thermally conductive particles 32 may include about 15% to about 95% of the thermal interface material 30 by weight. The first thermally conductive particles 32 are preferably uniformly distributed in the base 31. The first thermally conductive particles 32 have an original size of less than 100 nanometers, an original melting temperature, and a first thermal conductivity. The original size is also referred to as a first size and the original melting temperature is also referred to as a first melting temperature. The first melting temperature is below the maximum operating temperature.

Figure 3:
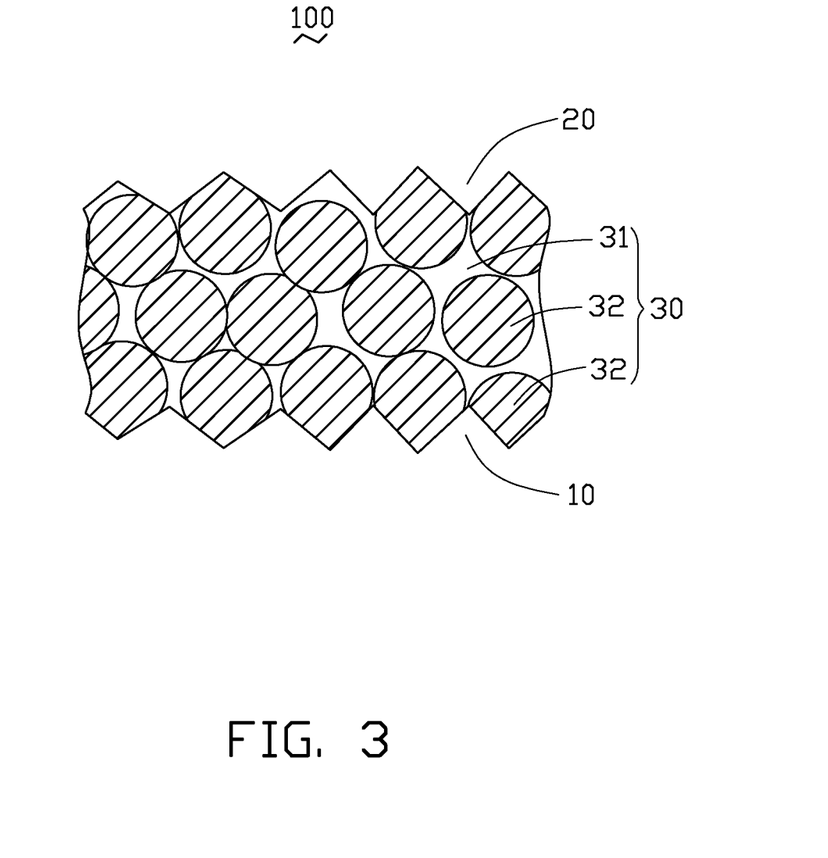
FIG. 3 is a view similar to FIG. 2 but after heating and subsequent cooling of the thermal interface material.

When the heat source 10 operates at a temperature above the first melting temperature and at or below the maximum operating temperature for the first time, the first thermally conductive particles 32 will melt and agglomerate. Then the first thermally conductive particles 32 are cooled and solidified to form larger thermally conductive particles 32, which have a second size, a second melting temperature, and a second thermal conductivity. The second size is, for example, larger than 100 nanometers and the second melting temperature is above the maximum operating temperature. The second thermal conductivity is larger than the first thermal conductivity.

In other words, the first thermally conductive particles 32 have a certain size, which monotonically changes from the first size to the second size when the heat source 10 operates at a temperature above the first melting temperature and at or below the maximum operating temperature for the first time. At the same time, a thermal conductivity of the first thermally conductive particles 32 monotonically changes from the first thermal conductivity to the second thermal conductivity. The first thermally conductive particles 32 may be made of metal or alloy and have a first size between about 1 nanometer and about 50 nanometers and have a first melting temperature between about 60° C. and about 100° C.

As an explanatory example, the first thermally conductive particles 32 can be made of materials with good heat conductivity, such as silver, gold, copper or tin-lead alloy. Although each of these materials normally has a high melting temperature at a normal macro-scale size, each of these materials will have a relatively low melting temperature when at nanometer sizes less than 100 nanometers. For example, silver at a normal size has a melting temperature of about 962° C., tin-lead alloy at normal size has a melting temperature of about 183° C.; however, when silver or tin-lead alloy is at the nanometer level, particularly having a first size between about 1 nanometer and about 50 nanometers, silver or tin-lead alloy will have a melting temperature below 120° C. Thus, when these materials are at the nanometer level, these materials can be melted by the heat generated by the heat source 10.

In this embodiment, the first thermally conductive particles 32 are tin-lead alloy particles having a first size between about 10 nanometers and about 20 nanometers and having a first melting temperature of about 91° C. It should be noted that, the first thermally conductive particles 32 may have the same or different sizes. Alternatively, the first thermally conductive particles 32 are silver particles having a first size of about 20 nanometers and having a first melting temperature of about 100° C.

Referring to FIG. 2, when the thermal interface material 30 is positioned between the heat source 10 and the heat dissipating device 20, the heat dissipating device 20 is pressed towards the heat source 10. As a result, the thermal interface material 30 is squeezed into the first tiny depressions 12 and the second tiny depressions 22. In this process, the first thermally conductive particles 32 enter into and expel air from the first tiny depressions 12 and the second tiny depressions 22 because the first size of the first thermally conductive particles 32 is smaller relative to the sizes of the first tiny depressions 12 and the second tiny depressions 22. Even when the sizes of the first tiny depressions 12 and the second tiny depressions 22 are at a nanometer level, the first tiny depressions 12 and the second tiny depressions 22 can still be filled up by the first thermally conductive particles 32. As a result, air in the first tiny depressions 12 and the second tiny depressions 22 can be expelled out from the interface, and the first thermally conductive particles 32 have a large surface directly contacting both the heat source 10 and the heat dissipating device 20, to quickly transfer heat from the heat source 10 to the heat dissipating device 20.

When the heat source 10 operates at a temperature below the first melting temperature, the heat source 10 generates a small amount of waste heat. The waste heat can be transferred away to the heat dissipating device 20 by the first thermally conductive particles 32 of the first size at a first rate. The first rate corresponds to the first thermal conductivity of the first thermally conductive particles 32.

Referring to FIG. 3, when the heat source 10 operates at a temperature above the first melting temperature and at or below the maximum operating temperature for the first time, the heat source 10 generates a large amount of waste heat, which heats up the first thermally conductive particles 32 causing them to fuse and agglomerate. When the temperature of the heat source 10 is reduced to below the first melting temperature, the first thermally conductive particles 32 are cooled and solidified and form bigger particles, which are of the second size and have the second thermal conductivity and the second melting temperature. When the heat source 10 operates at the temperature above the first melting temperature and at or below the maximum operating temperature again, heat generated by the heat source 10 is transferred to the heat dissipating device 20 by the first thermally conductive particles 32 of the second size at a second rate. The second rate corresponds to the second thermal conductivity of the first thermally conductive particles 32. The second rate is faster than the first rate because the second thermal conductivity is greater than the first thermal conductivity.

As described above, the first thermally conductive particles 32 of the first size which is less than 100 nanometers have the first melting temperature which is lower than the second melting temperature of the first thermally conductive particles 32 of the second size which is larger than 100 nanometers. Thus, a material with high thermal conductivity and high melting temperature at a normal size, can be effectively used in the thermal interface material 30 by forming the material into particles having a first size less than 100 nanometers. Then the first thermally conductive particles 32 can be made of many different materials which are not usually used in thermal interface materials due to their high melting temperature and to suit the operating temperatures of different heat sources 10. In the examples given above, the first thermally conductive particles 32 is made of tin-lead alloy particles and has a first melting temperature of about 91° C. and a second melting temperature of about 183° C.

Furthermore, when the first thermally conductive particles 32 are heated and fused, the first thermally conductive particles 32 of the second size can directly contact surfaces of the first tiny depressions 12 and the second tiny depressions 22, because before fusing the first thermally conductive particles 32 of the first size have already entered into the first tiny depressions 12 and the second tiny depressions 22. Thus, the thermal interface material 30 can greatly reduce the thermal resistance between the heat dissipating surface 11 and the heat absorbing interface 21. Heat generated by the heat source 10 can be quickly transferred to the heat dissipating device 20 through a heat transfer path defined by the first thermally conductive particles 32 of the second size.

Since the first thermally conductive particles 32 of the second size have a large contacting surface with the base 31, this can greatly reduce the thermal resistance between the base 31 and the first thermally conductive particles 32. Part of the heat absorbed by the first thermally conductive particles 32 can be quickly transferred to the base 31 and uniformly spread throughout the thermal interface material 30. This helps to make full use of the heat dissipating device 20 to dissipate heat.

Figure 4:
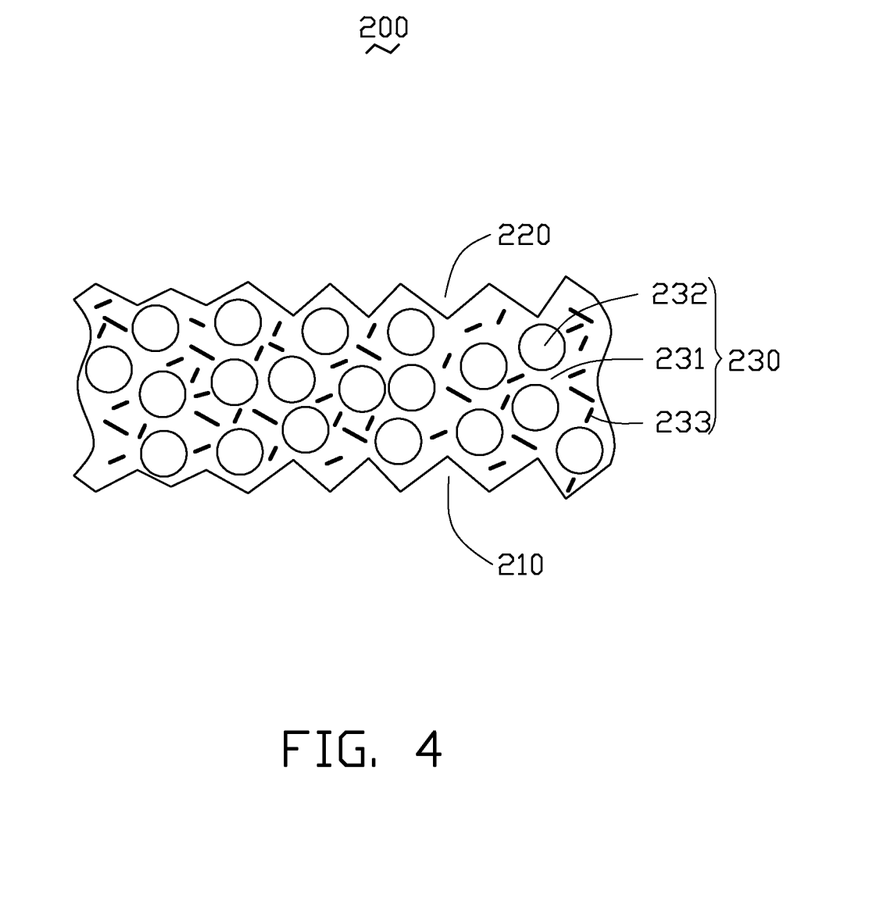
FIG. 4 is a schematic cross-sectional view of a microstructure of a second embodiment of a thermal interface material before heating.
Figure 5:
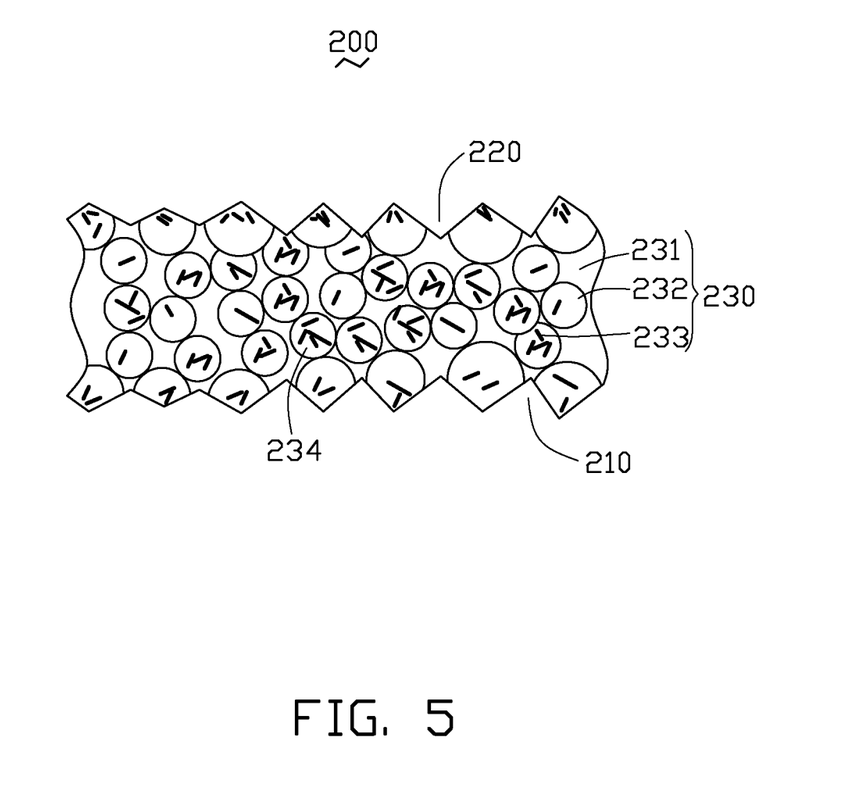
FIG. 5 is a view similar to FIG. 4 but after heating and subsequent cooling of the thermal interface material.

FIG. 4 and FIG. 5 show a second embodiment of a thermal interface material 230 used in another embodiment of an electronic assembly 200. Referring to FIG. 4 and FIG. 5, the electronic assembly 200 is similar to the electronic assembly 100 and includes a heat source 210, a heat dissipating device 220, and the thermal interface material 230 inserted between and used for thermal coupling the heat source 210 and the heat dissipating device 220. The main difference between the embodiments of the two electronic assemblies 100, 200 is the thermal interface material 230. The second embodiment of the thermal interface material 230 is similar to the first embodiment of the thermal interface material 30, including a base 231 and a plurality of first thermally conductive particles 232, but also including a plurality of second thermally conductive particles 233, which have a melting temperature above the maximum operating temperature.

The second thermally conductive particles 233 may comprise about 1% to about 25% of the thermal interface material 230 by weight. The second thermally conductive particles 233 may be carbon nanotubes, carbon fibers and the like which preferably have a thermal conductivity higher than that of the first thermally conductive particles 232. The second thermally conductive particles 233 are uniformly dispersed in the base 231. If the first thermally conductive particles 232 are made of metal or alloy, surfaces of the second thermally conductive particles 233 can be modified to increase soakage of the second thermally conductive particles 233 into the metal or alloy. For example, a layer of the metal or alloy can be coated or plated on the surfaces of the second thermally conductive particles 233 through chemical plating or other methods.

In operation of the electronic assembly 200, when the heat source 210 operates at a temperature above the first melting temperature and at or below the maximum operating temperature for the first time, the heat source 210 generates a large amount of waste heat, which heats up the first thermally conductive particles 232 to fuse and agglomerate, forming bigger particles. In this process, the second thermally conductive particles 233 will not melt and are drawn into the larger first thermally conductive particles 232. When the first thermally conductive particles 232 are cooled and solidified, a plurality of composite thermally conductive particles 234 is formed. In each of the composite thermally conductive particles 234, at least one second thermally conductive particle 233 is located within one corresponding first thermally conductive particle 232 of the second size. The composite thermally conductive particles 234 contact one another and a heat transfer path is defined between the heat source 210 and the heat dissipating device 220.

The thermal interface material 230 can transfer heat from the heat source 210 to the heat dissipating device 220 more quickly because of the presence of the second thermally conductive particles 233 with a higher thermal conductivity. In addition, the second thermally conductive particles 233 can greatly increase the strength and rigidity of the thermal interface material 230 to support relatively heavier heat dissipating devices 220 if needed.

An embodiment of a method of using the thermal interface material 30 will now be described. Depending on the embodiment, certain of the steps described below may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps. The method of using the thermal interface material 30 comprises the following steps.

Step (a): providing one thermal interface material 30 and one heat source 10 as described above.

Step (b): disposing the thermal interface material 30 on the heat source 10.

Step (c): heating the thermal interface material 30 to a temperature which is above the first melting temperature and at or below the maximum operating temperature. As a result, the thermal interface material 30 is melted and the first thermally conductive particles 32 fuse and agglomerate to form larger conductive first thermally conductive particles. Particularly, if the time of heating is long enough, the first thermally conductive particles 32 will agglomerate together to form a single particle. In this step, the heat source 10 may operate at the temperature which is above the first melting temperature and at or below the maximum operating temperature, so that the first thermally conductive particles 32 can be heated to a fusing point by the heat generated by the heat source 10.

Step (d): installing one heat dissipating device 20 as described above on the thermal interface material 30 when the thermal interface material 30 is in the fused state. In this process, the heat dissipating device 20 can be pressed towards the heat source 10 so that the thermal interface material 30 can tightly contact both the heat source 10 and the heat dissipating device 20. At the same time, a distance between the heat source 10 and the heat dissipating device 20 can also be adjusted so as to shorten the heat transfer path between the heat source 10 and the heat dissipating device 20.

Step (e): cooling the thermal interface material 30. In this process, the first thermally conductive particles 32 are cooled and solidified to form bigger particles, which have the second size and the second melting temperature. The second size is larger than 100 nanometers and the second melting temperature is above the maximum operating temperature.

After the above steps, the thermal interface material 30 bonds the heat source 10 to the heat dissipating device 20. When the heat source 10 operates at the temperature above the first melting temperature and at or below the maximum operating temperature again, the first thermally conductive particles 32 will not go through a fusing process and heat generated by the heat source 10 is transferred to the heat dissipating device 20 by the first thermally conductive particles 32 of the second size.

Additionally, the step of installing one heat dissipating device 20 as described above on the thermal interface material 30 can be carried out after the step (b), but before the step (c). Then the step (d) can be omitted. Moreover, when the thermal interface material 230 contains the second thermally conductive particles 233, then in the step (c) the second thermally conductive particles 233 move from outside of the first thermally conductive particles 232 of the first size into the first thermally conductive particles 232 of the second size when the first thermally conductive particles 232 are fusing.

While the present disclosure has been described, the embodiments can be further modified within the spirit and scope of this disclosure. This application is therefore intended to cover any variations, uses, or adaptations of the embodiments using the general principles of the disclosure as claimed. Furthermore, this application is intended to cover such departures from the present disclosure as come within known or customary practice in the art to which the disclosure pertains and which fall within the limits of the appended claims or equivalents thereof.

What is claimed is:

1. An electronic assembly comprising:
a heat source having a maximum operating temperature;
a heat dissipating device; and
a thermal interface material sandwiched between the heat source and the heat dissipating device, the thermal interface material comprising:
a base; and
first thermally conductive particles dispersed in the base, the first thermally conductive particles having a size monotonically changing from a first size less than 100 nanometers to a second size larger than 100 nanometers, the first thermally conductive particles of the first size having a first melting temperature below the maximum operating temperature, the first thermally conductive particle of the second size having a second melting temperature above the maximum operating temperature when the heat source operates at a temperature above the first melting temperature and at or below the maximum operating temperature, wherein when the heat source operates at a temperature above the first melting temperature and at or below the maximum operating temperature for a first time, the first thermally conductive particles of the first size fuse and agglomerate; when the temperature of the heat source is subsequently reduced to below the first melting temperature, the first thermally conductive particles of the second size are formed; when the heat source operates at the temperature above the first melting temperature and at or below the maximum operating temperature after the first time, the first thermally conductive particles of the second size are adapted to transfer heat generated by the heat source.

2. The electronic assembly as described in claim 1, wherein the first thermally conductive particles of the first size have a first thermal conductivity; the first thermally conductive particles of the second size have a second thermal conductivity higher than the first thermal conductivity.

3. The electronic assembly as described in claim 1, wherein the first thermally conductive particles comprise about 15% to about 95% of the thermal interface material by weight.

4. The electronic assembly as described in claim 1, wherein the thermal interface material further comprises a plurality of second thermally conductive particles dispersed in the base, and the second thermally conductive particles have a melting temperature above the maximum operating temperature.

5. The electronic assembly as described in claim 4, wherein the second thermally conductive particles comprise about 1% to about 25% of the thermal interface material by weight.

6. The electronic assembly as described in claim 4, wherein the first thermally conductive particles are made of metal or alloy, and the second thermally conductive particles are carbon nanotubes or carbon fibers, and a layer of the metal or alloy is formed on surfaces of the second thermally conductive particles.

7. The electronic assembly as described in claim 1, wherein the first thermally conductive particles are tin-lead alloy particles, the first size is between about 10 nanometers and about 20 nanometers, the first melting temperature is about 91° C. and the second melting temperature is about 183° C.

8. The electronic assembly as described in claim 1, wherein the first thermally conductive particles are silver particles, the first size is about 20 nanometers, the first melting temperature is about 100° C. and the second melting temperature is about 962° C.

9. The electronic assembly as described in claim 1, wherein the heat dissipating device comprises a substrate and a plurality of fins vertically arranged on the substrate, and one surface of the substrate contacting the thermal interface material has a plurality of second tiny depressions defined therein, and the second tiny depressions are filled up by the thermal interface material.

10. A thermal interface material comprising:
a base; and
first thermally conductive particles located within the base, the first thermally conductive particles having a size monotonically changing from a first size less than 100 nanometers to a second size larger than 100 nanometers, the first thermally conductive particles of the first size having a first melting temperature, the first thermally conductive particle of the second size having a second melting temperature above the first melting temperature when the first thermally conductive particles are heated to a temperature above the first melting temperature, wherein when the heat source operates at a temperature above the first melting temperature and at or below the maximum operating temperature for a first time, the first thermally conductive particles of the first size fuse and agglomerate; when the temperature of the heat source is subsequently reduced to below the first melting temperature, the first thermally conductive particles of the second size are formed; when the heat source operates at the temperature above the first melting temperature and at or below the maximum operating temperature after the first time, the first thermally conductive particles of the second size are adapted to transfer heat generated by the heat source.

11. The thermal interface material as described in claim 10, wherein the first thermally conductive particles of the first size have a first thermal conductivity and the first thermally conductive particles of the second size have a second thermal conductivity, and the second thermal conductivity is larger than the first thermal conductivity.

12. The thermal interface material as described in claim 10, wherein the first thermally conductive particles comprise about 15% to about 95% of the thermal interface material by weight.

13. The thermal interface material as described in claim 10, wherein the thermal interface material further comprises a plurality of second thermally conductive particles located within in the base, and the second thermally conductive particles have a melting temperature above the first melting temperature.

14. The thermal interface material as described in claim 13, wherein the second thermally conductive particles comprise about 1% to about 25% of the thermal interface material by weight.

15. The thermal interface material as described in claim 13, wherein the first thermally conductive particles are made of metal or alloy, and the second thermally conductive particles are carbon nanotubes or carbon fibers, and a layer of the metal or alloy is formed on surfaces of the second thermally conductive particles.

16. The thermal interface material as described in claim 13, wherein the first thermally conductive particles are made of metal, alloy or a mixture of metal and alloy, and have a first size between about 1 and about 50 nanometers and have a first melting temperature between about 60° C. and about 100° C.

17. A method of using a thermal interface material comprising the following steps:
providing the thermal interface material and a heat source having a maximum operating temperature, wherein the thermal interface material comprises a base and a plurality of first thermally conductive particles located within the base, and the first thermally conductive particles have a size monotonically changing from a first size less than 100 nanometers and a first melting temperature below the maximum operating temperature, to a second size larger than 100 nanometers and a second melting temperature above the first melting temperature when the first thermally conductive particles are heated to a temperature above the first melting temperature;
disposing the thermal interface material on the heat source;
heating the thermal interface material to a temperature which is above the first melting temperature and at or below the maximum operating temperature so that the first thermally conductive particles fuse and agglomerate and form bigger first thermally conductive particles of the second size;

cooling the thermal interface material so that the first thermally conductive particles are cooled and solidified to form the bigger first thermally conductive particles of the second size, which have the second size and the second melting temperature.

18. The method of claim 17, wherein in the step of heating the thermal interface material, the heat source operates at the temperature which is above the first melting temperature and at or below the maximum operating temperature, so that the first thermally conductive particles are heated up to fuse by heat generated by the heat source.

19. The method of claim 17, further comprising a step of installing a heat dissipating device on the thermal interface material after the step of disposing the thermal interface material on the heat source but before the step of cooling the thermal interface material.

20. The electronic assembly as described in claim 1, wherein the first melting temperature is corresponding to the first thermally conductive particles of the first size, the second melting temperature is corresponding to the first thermally conductive particles of the second size.

* * * * *